(12) United States Patent
Togawa (10) Patent No.: US 7,129,578 B2
(45) Date of Patent: Oct. 31, 2006

(54) SUBSTRATE FOR SEMICONDUCTOR DEVICE, MANUFACTURING METHOD THEREOF, SEMICONDUCTOR DEVICE, AND FRAME MAIN BODY

(75) Inventor: Miyoshi Togawa, Oita (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 10/152,855

(22) Filed: May 23, 2002

(65) Prior Publication Data

US 2002/0195695 A1    Dec. 26, 2002

(30) Foreign Application Priority Data

May 30, 2001    (JP)    ............................ P2001-163010

(51) Int. Cl.
| | | |
|---|---|---|
| H01L 23/495 | (2006.01) | |
| H01L 23/04 | (2006.01) | |
| H01L 29/40 | (2006.01) | |
| H05K 1/00 | (2006.01) | |
| H05K 1/16 | (2006.01) | |
| H01R 12/04 | (2006.01) | |

(52) U.S. Cl. ...................... 257/730; 257/668; 257/784; 257/786; 174/250; 174/260; 174/261
(58) Field of Classification Search ................ 257/666, 257/678

See application file for complete search history.

(56) References Cited

U.S. PATENT DOCUMENTS

| | | | | |
|---|---|---|---|---|
| 3,973,817 | A * | 8/1976 | Stalley et al. .................. 439/60 |
| 4,763,409 | A * | 8/1988 | Takekawa et al. ............ 29/827 |
| 4,790,894 | A * | 12/1988 | Homma et al. ............. 156/250 |
| 4,802,277 | A * | 2/1989 | Root ........................... 29/846 |
| 5,046,953 | A * | 9/1991 | Shreeve et al. ............... 439/66 |
| 5,140,745 | A * | 8/1992 | McKenzie, Jr. ............... 29/852 |
| 5,274,197 | A * | 12/1993 | Kondo et al. ................ 174/267 |
| 5,334,857 | A * | 8/1994 | Mennitt et al. ................ 257/48 |
| 5,452,511 | A * | 9/1995 | Chang .......................... 29/827 |
| 5,490,324 | A * | 2/1996 | Newman ...................... 29/830 |
| 5,528,078 | A * | 6/1996 | Shin ............................. 257/676 |
| 5,729,437 | A * | 3/1998 | Hashimoto .................. 361/760 |
| 6,147,876 | A * | 11/2000 | Yamaguchi et al. ........ 361/766 |
| 6,278,178 | B1 * | 8/2001 | Kwon et al. ................. 257/684 |
| 6,400,010 | B1 * | 6/2002 | Murata ........................ 257/706 |
| 6,452,112 | B1 * | 9/2002 | Terashima et al. .......... 174/260 |
| 6,534,726 | B1 * | 3/2003 | Okada et al. ................ 174/263 |

(Continued)

FOREIGN PATENT DOCUMENTS

JP    362291053    * 12/1987

Primary Examiner—Carl Whitehead, Jr.
Assistant Examiner—James M. Mitchell
(74) Attorney, Agent, or Firm—Rader Fishman & Grauer; Ronald P. Kananen (57) ABSTRACT

A lead frame comprises a lead frame body having cut-away portions cut away from the side surfaces of the lead frame body, a die pad for securing a semiconductor chip, bonding electrodes surrounding the die pad, external electrodes for allowing the lead frame to be mounted, wiring for surface treatment extending on the lead frame body with its end being located at a portion of each of the side surfaces of the lead frame body, the portion being opposed to the cut-away portions. The bonding electrode and the wiring for surface treatment, as well as the external electrode and the wiring for surface treatment, are electrically connected, respectively. Even when the lead frame is electrostatically charged by friction with a transfer unit, the semiconductor chip on the lead frame avoids electrostatic damage.

6 Claims, 9 Drawing Sheets

U.S. PATENT DOCUMENTS

| | | | |
|---|---|---|---|
| 6,538,212 B1 * | 3/2003 | Abe | 174/261 |
| 6,760,227 B1 * | 7/2004 | Sakai et al. | 361/736 |
| 6,862,190 B1 * | 3/2005 | Olzak et al. | 361/768 |
| 7,041,527 B1 * | 5/2006 | Wu | 438/65 |
| 2001/0030357 A1 * | 10/2001 | Murata | 257/678 |
| 2002/0053742 A1 * | 5/2002 | Hata et al. | 257/774 |
| 2002/0108778 A1 * | 8/2002 | Dishongh et al. | 174/261 |

* cited by examiner

SUBSTRATE FOR SEMICONDUCTOR DEVICE, MANUFACTURING METHOD THEREOF, SEMICONDUCTOR DEVICE, AND FRAME MAIN BODY

BACKGROUND OF THE INVENTION

1. Field of the Invention

The present invention relates generally to a substrate for a semiconductor device, a manufacturing method thereof, a semiconductor device, and a frame main body. More particularly, it relates to the substrate for a semiconductor device and the like wherein an insulating substrate body for mounting the semiconductor device has a cut-away portion cut away from a side surface thereof and the wiring for surface treatment extends on the insulating substrate body with an end thereof gathering in a portion of a side surface of the insulating substrate body, the portion being opposed to the cut-away portion, thereby preventing the wiring for surface treatment from extending through the side surface of the insulating substrate body, so that even when the substrate gets static electricity during the transfer thereof, the semiconductor chip can avoid electrostatic damage.

2. Description of Related Art

In recent years, there have been demands for higher speed and downsizing of semiconductor devices. As semiconductor devices capable of meeting the higher speed and downsizing requirements, Land Grid Array (LGA), Ball Grid Array (BGA), and the like are known.

Figure 1:
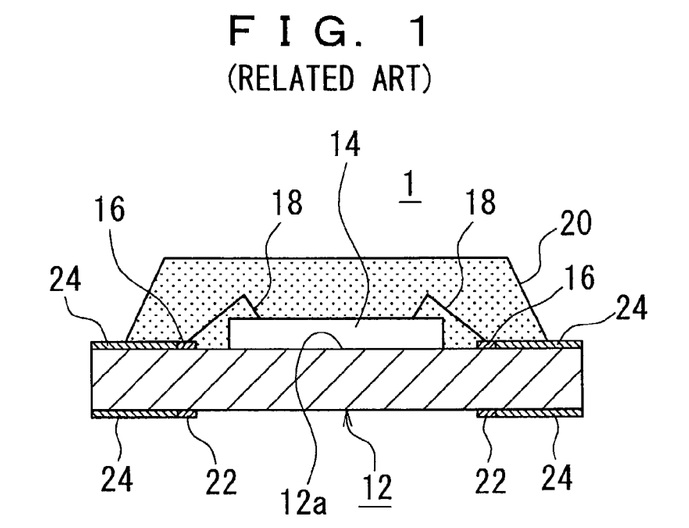
FIG. 1 is a cross-sectional view of a semiconductor device using a semiconductor device in accordance with the related art.
Figure 2:
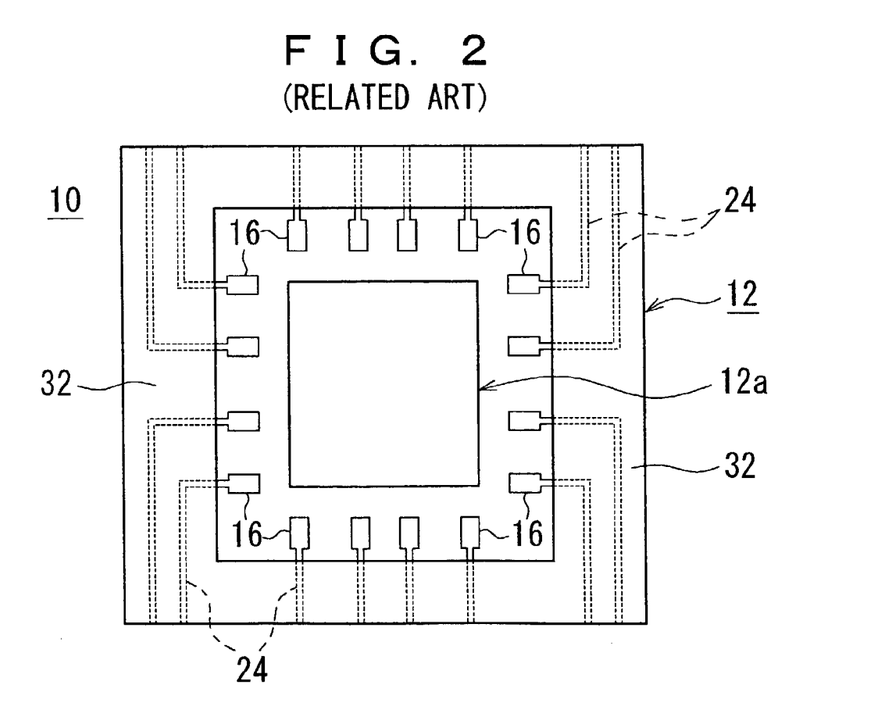
FIG. 2 is a plan view of a substrate for a semiconductor device of the related art.

Out of these, the LGA is configured as shown in FIGS. 1 and 2. FIG. 1 is a sectional side elevation of the semiconductor device 1, and FIG. 2 shows a segment of a lead frame 10, which is a substrate for a semiconductor device used in the semiconductor device 1 as shown in FIG. 1.

The lead frame 10 comprises a lead frame body 12, which is an insulating substrate body. A die pad 12a disposed on a top surface of the lead frame body 12 mounts a semiconductor chip 14, which is included in the semiconductor device 1. Around the die pad portion 12a, a plurality of bonding electrodes (lands) 16 is deposited and formed so as to surround it as shown in FIG. 2. Electrodes of the semiconductor chip 14 connect the bonding electrodes 16 with gold wires 18 as shown in FIG. 1. The top surface side of the lead frame body 12 is molded (sealed) by a resin 20 so that the semiconductor chip 14, the gold wires 18, and the bonding electrodes 16 are respectively covered thereby.

On the bottom surface of the lead frame body 12, external electrodes 22 for allowing the lead frame 10 to be mounted are deposited and formed. Each of the external electrodes 22 is electrically connected to the bonding electrode 16. As is well known, the electrical conduction between the bonding electrodes 16 and the external electrodes 22 is accomplished by through holes, or the like.

Each of the surfaces of the bonding electrodes 16 and the external electrodes 22 is subjected to surface treatment for satisfactorily ensuring bonding with the semiconductor chip 14 and joint with soldering paste applied onto a substrate for mounting.

The surface treatment is generally plating treatment. The plating treatment is carried out in the following manner. First, for example, the surface is subjected to a nickel-plating treatment for the undercoat and then subjected to a gold-plating treatment. As is well known, an electroplating process is often used as the process for performing the plating treatment. As shown in FIGS. 1 and 2, both the bonding electrodes 16 and the external electrodes 22 have wiring for plating treatment (wiring 24 for surface treatment), respectively. The wiring 24 for surface treatment passes a current to carry out the electroplating process.

Figure 3:
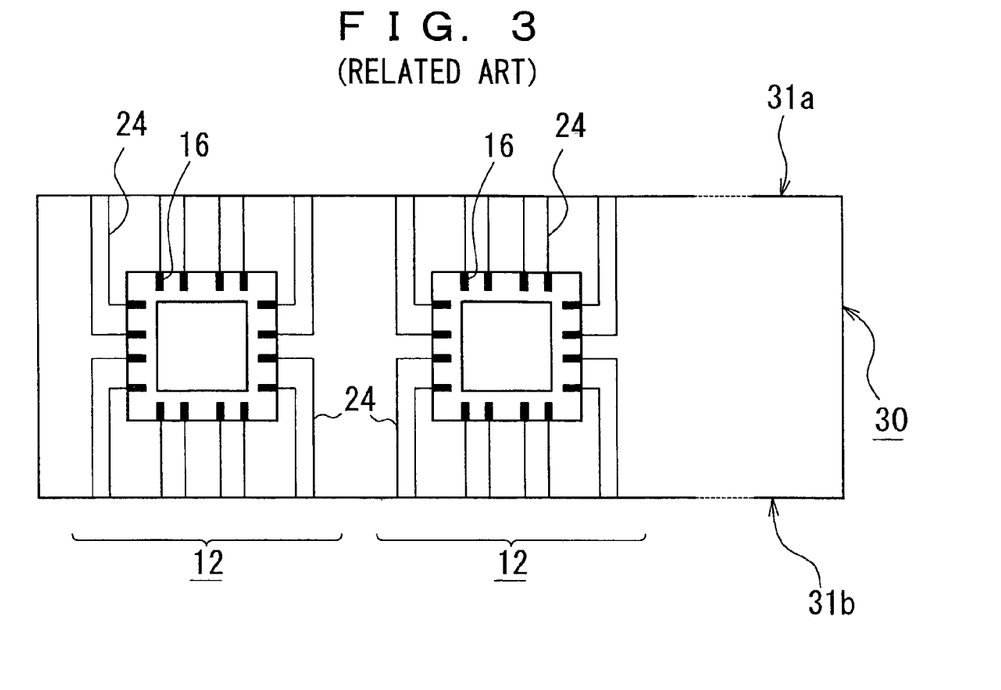
FIG. 3 is a plan view showing a frame main body of the related art.

FIG. 3 shows a frame main body 30 prior to cutting it into the lead frames 10 for use for semiconductor chips. The frame main body 30 is an insulating substrate having a size capable of providing several lead frames 10. All the wiring 24 for surface treatment extend on the frame main body 30 with the ends thereof being led through the opposite side surfaces 31a and 31b. Solder resist layer generally insulates the upper and lower opposite surfaces of the lead frame body 12 except for an area including the bonding electrodes 16. Namely, an area 32 and the die pad 12a which mounts the semiconductor chip 14, are insulated in a case shown in FIG. 2.

Herein, the cut ends of the wiring 24 for surface treatment are exposed from the side surfaces 31a and 31b of the frame main body 30. This is apparent from the configuration of FIG. 4.

Figure 4:
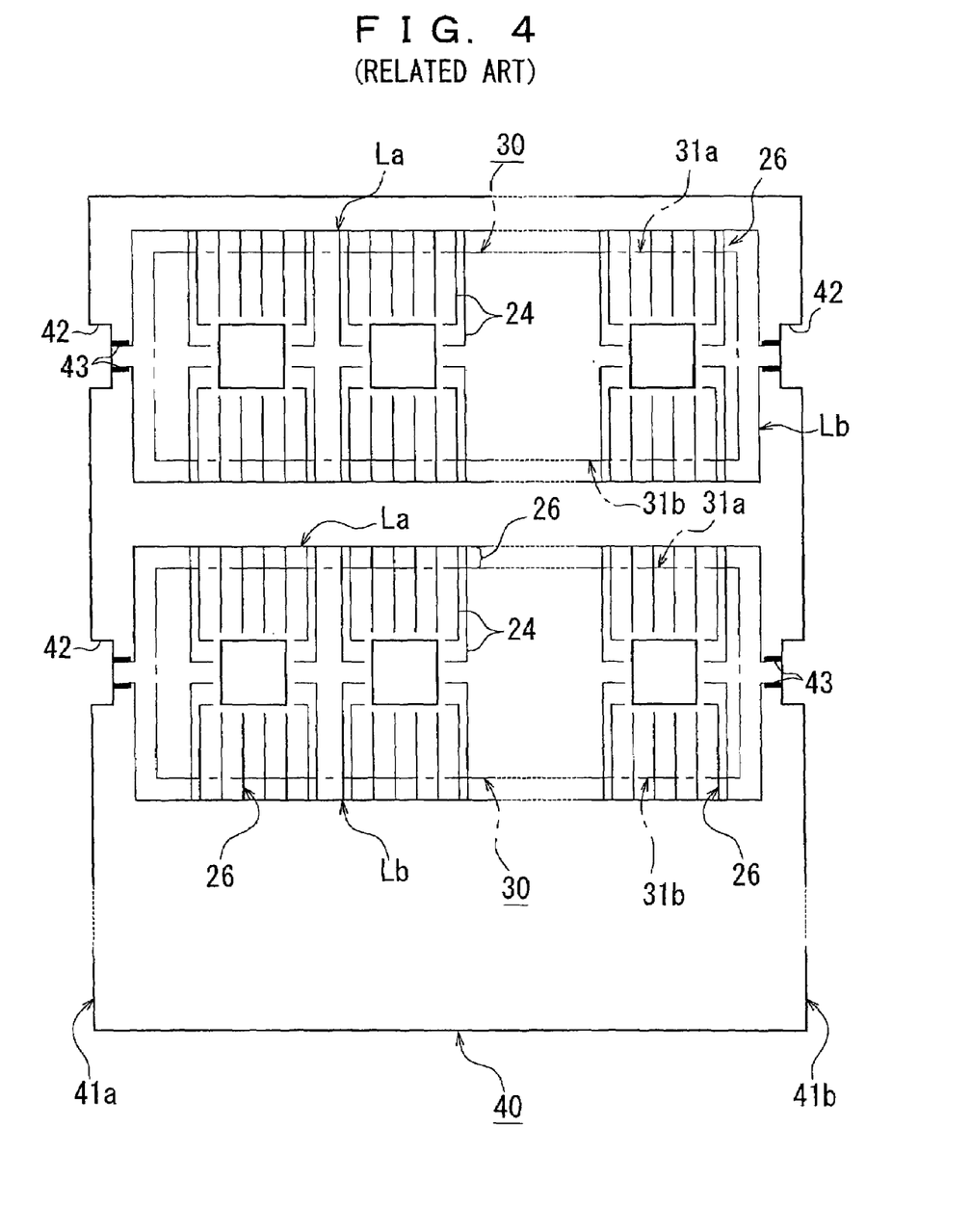
FIG. 4 is a plan view of an original plate for providing the frame main bodies of the related art.

As shown in FIG. 4, an original plate 40 for providing the lead frame main bodies 30 is an insulating substrate having a size capable of forming therein a plurality of frame main bodies 30. The original plate 40 has secondary lines 26, which are the lines obtained by extending the wiring 24 for surface treatment, from the opposite side surfaces (the portions which will be the side surfaces 31a, 31b after cutting) of each of the frame main bodies 30. A large number of these secondary lines 26 are all connected to buses La and Lb wired at upper and lower sections, respectively, of the frame main body 30.

Then, the wiring 24 for surface treatment, the secondary lines 26, and a pair of the buses La and Lb of the frame main body 30 are patterned so that the buses La and Lb are led through openings 42, 42 provided on the left and right side faces 41a and 41b of the original plate 40. Further, connection terminals (electrode terminals) 43, 43 for the buses La and Lb are deposited and formed on a portion of the original plate 40 opposed the opening 42. The connection terminals 43, 43 are the electrodes to be used for the plating treatment.

Then, applying a prescribed voltage to the buses La and Lb while immersing the original plate 40 in a prescribed plating bath allows the bonding electrodes 16 and the external electrodes 22 to be subjected to the plating treatment. After the plating treatment, the original plate 40 is cut along the dot-dash lines shown in FIG. 4 to obtain a plurality of the frame main bodies 30 shown in FIG. 3. Therefore, when the original plate 40 is divided into the frame main bodies 30, the wiring 24 for surface treatment and their respective secondary lines 26 are separated from each other. The wiring 24 for surface treatment leads through the opposite side surfaces 31a and 31b of the frame main body 30. As the result thereof, the respective cut ends of the wiring 24 for surface treatment are exposed from the opposite side surfaces 31a and 31b of the frame main body 30.

Incidentally, after completion of the division into frame main bodies 30 as shown in FIG. 3, generally, no frame main body 30 is cut into lead frames (segments) each having a size corresponding to each semiconductor chip. Thus, the fixing of the semiconductor chip 14, the wire bonding, and the mold treatment by a resin are performed on the frame main body 30. The frame main body 30 is transferred to respective processing steps, or subjected to a chucking process while remaining the same size as the frame main body 30.

During the transfer process and the chucking process, a transfer unit and a chucking unit often come into contact with the insulating substrate body, which is the lead-frame body 12. Accordingly, when the lead frame body 12 is rubbed, a surface of the lead frame body 12 may be electrostatically charged. If the surface of the lead frame body 12 is electrostatically charged, discharge occurs when the surface of the lead frame body 12 moves closer to a metallic portion of the transfer unit or the chucking unit. Discharge current at this step flows in the semiconductor chip 14 via the wiring 24 for surface treatment. Alternatively, discharge occurs between the metallic portion of the transfer unit or the chucking unit and the wiring 24 for surface treatment. In this case, discharge current flows into the semiconductor chip 14. By such a repetition of charging and discharging, the semiconductor chip may be damaged by static electricity.

As the semiconductor devices having a high possibility of being damaged by static electricity, mention may be made of higher density-, and downsizing-oriented LGA, BGA, and the like. As described above, with the semiconductor device having a higher speed of processing and a higher density, the reduction in size of a single semiconductor element and the reduction in thickness of an oxide film with miniaturization in wafer processing are remarkable. Therefore, such a semiconductor device is susceptible to static electricity. As a result, the semiconductor element in the semiconductor device has a high possibility of undergoing electrostatic damage (ESD damage) also due to slight charging and discharging.

One object of the present invention is to improve the capacity for effective protection against electrostatic damage of the substrate for a semiconductor device, the semiconductor device, and the like.

Another object of the invention is to provide a substrate for a semiconductor device, a semiconductor device, and the like, which are capable of effectively preventing electrostatic damage by achieving an electrically disconnected state.

A further object of the invention is to provide a manufacturing method for manufacturing the substrate for a semiconductor device, which is capable of effectively preventing electrostatic damage to a semiconductor device.

SUMMARY OF THE INVENTION

According to the present invention, the foregoing objects are attained by a substrate for a semiconductor device having an insulating substrate body. The insulating substrate body has cut-away portions cut away from its side surfaces. Wiring for surface treatment extends on the insulating substrate body and its ends are present on portions of each of the side surfaces of the insulating substrate body, each portion being opposed to the cut-away portion. The substrate for a semiconductor device further comprises a die pad for securing a semiconductor chip, and a plurality of bonding electrodes, a plurality of external electrodes for allowing the substrate for semiconductor device to be mounted. The die pad is positioned on the insulating substrate body. The bonding electrodes surround the die pad. Each of the external electrodes is electrically connected to the bonding electrode and positioned under the insulating substrate body. The bonding electrode and the wiring for surface treatment, as well as the external electrode and the wiring for surface treatment are electrically connected, respectively.

Friction occurs due to rubbing of the wiring for surface treatment to be used for surface treatment against a transfer block or a chucking block. According to the prevent invention, in order to prevent the static electricity charged at this time from flowing current to the semiconductor chip through the wiring for surface treatment, the respective ends of the wiring for surface treatment are present on portions of each of the side surfaces of the insulating substrate body, each portion being opposed to the cut-away portion.

With this configuration, even if the end faces of the substrate for the semiconductor device is electrostatically charged by friction with the transfer unit or the chucking unit during transfer or chucking, no discharge current flows through the wiring for surface treatment because no end of the wiring for surface treatment comes into contact with the transfer unit or the chucking unit. Therefore, even for a semiconductor chip of an LGA or BGA type, or the like, which tends to undergo electrostatic damage, it is possible to effectively protect the semiconductor chip from damage by static electricity (electrostatic damage).

In accordance with one aspect of the invention, wiring for supplying power to the semiconductor chip and for grounding may be provided. The wiring for supplying power to the semiconductor chip and for grounding is located at a side surface of the insulating substrate body, except for the cut-away portion. Alternatively, the wiring for supplying power to the semiconductor chip and for grounding is located on both sides of the wiring for surface treatment. Namely, the wiring for surface treatment is positioned between one wiring for supplying power to the semiconductor chip and for grounding and the other wiring for supplying power to the semiconductor chip and for grounding.

According to this aspect of the invention, when the semiconductor chip of the above aspect is charged, discharge occurs from the semiconductor chip via the wiring for the power supply or grounding. As a result, it is possible to prevent the semiconductor chip from electrostatic damage.

In accordance with another aspect of the invention, a substrate for a semiconductor device comprises a insulating substrate body having an opening therein and wiring for surface treatment extending on the insulating substrate body. The opening divides the wiring for surface treatment at midpoint.

According to the invention, the wiring for surface treatment refrains from acting as discharge paths of the static electricity including the semiconductor chip.

In accordance with further aspect of the invention, a method for manufacturing the above substrates for the semiconductor device comprises cutting the wiring for surface treatment after performing the surface treatment on the bonding electrode and the external electrode using the wiring for surface treatment, and undergoing a mounting operation for mounting the semiconductor chip after the cut processing.

In accordance with such manufacturing method including the steps of cutting the wiring for the surface treatment by slitting it, or the like, after a surface treatment, ends of the wiring for surface treatment may be exposed at the side surfaces of the insulating substrate body. Since, if so, the internal wiring for surface treatment is electrically disconnected, no discharge current of static electricity flows through the semiconductor chip via the wiring for surface treatment. As a result, there is no risk that the semiconductor chip will be damaged by static electricity.

In accordance with still further aspect of the invention, a substrate for a semiconductor device comprises an insulating substrate body on which wiring for connecting a bonding electrode and an external electrode for allowing the substrate for a semiconductor device to be mounted extends. Ends of the wiring for connecting the bonding electrode and the external electrode are located at the inside from the side surfaces of the insulating substrate body. A die pad is positioned on the insulating substrate body. A plurality of bonding electrodes surrounds the die pad. Each external electrode is electrically connected to the bonding electrode and positioned under the insulating substrate body.

According to this aspect of the invention, the positions at which the wiring for connecting the bonding electrodes and the external electrodes respectively formed on the upper and lower opposite sides of the insulating substrate body is formed are restricted. Therefore, the wiring for connecting the bonding electrodes and the external electrodes cannot extend to the side surfaces of the insulating substrate body. In this case, an electroless plating treatment as the surface treatment is performed for the following reason. For the electroless plating treatment, the wiring for surface treatment are not required, and hence there is no necessity to extend the wiring for surface treatment to the side surfaces of the insulating substrate body.

In accordance with another aspect of the invention, a semiconductor device comprises a substrate for a semiconductor device having an insulating substrate body, a semiconductor chip secured on the substrate for a semiconductor device, and sealing compound for sealing the semiconductor chip. The substrate for a semiconductor device provides a bonding electrode on a side on which the semiconductor chip is mounted. The substrate for a semiconductor device also provides an external electrode for allowing the substrate for a semiconductor device to be mounted on the opposite side. The bonding electrode and the external electrode are provided with wiring for surface treatment. The wiring for surface treatment extends on the insulating substrate body, and its ends are located at a portion of each of the side surfaces of the insulating substrate body, the portion being an opposed cut-away portion cut away from the side surface of the insulating substrate body.

By doing as described above, it is possible to provide the substrate for a semiconductor device resistant to electrostatic damage. Further, by using the substrate for a semiconductor device, it is possible to provide a semiconductor device resistant to electrostatic damage.

In accordance with a still further aspect of the invention, frame main bodies comprising a plurality of substrates for semiconductor device described above are provided. According to these frame main bodies, it is possible to provide a substrate for a semiconductor device resistant to electrostatic damage.

The conclusion unit of this specification particularly points out and distinctly claims the subject matter of the present invention. Those skilled in the art, however, will best understand both the organization and the method of operation of the invention, together with further advantages and objects thereof, by reading the remaining portion of the specification in view of the accompanying drawing(s) wherein like reference characters refer to like elements.

DETAILED DESCRIPTION OF THE PREFERRED EMBODIMENT(S)

Subsequently, preferred embodiments of a substrate for a semiconductor device, a manufacturing method for manufacturing the same, a semiconductor device, and a frame main body in accordance with this invention will be described in detail by reference to the drawings.

Figure 5:
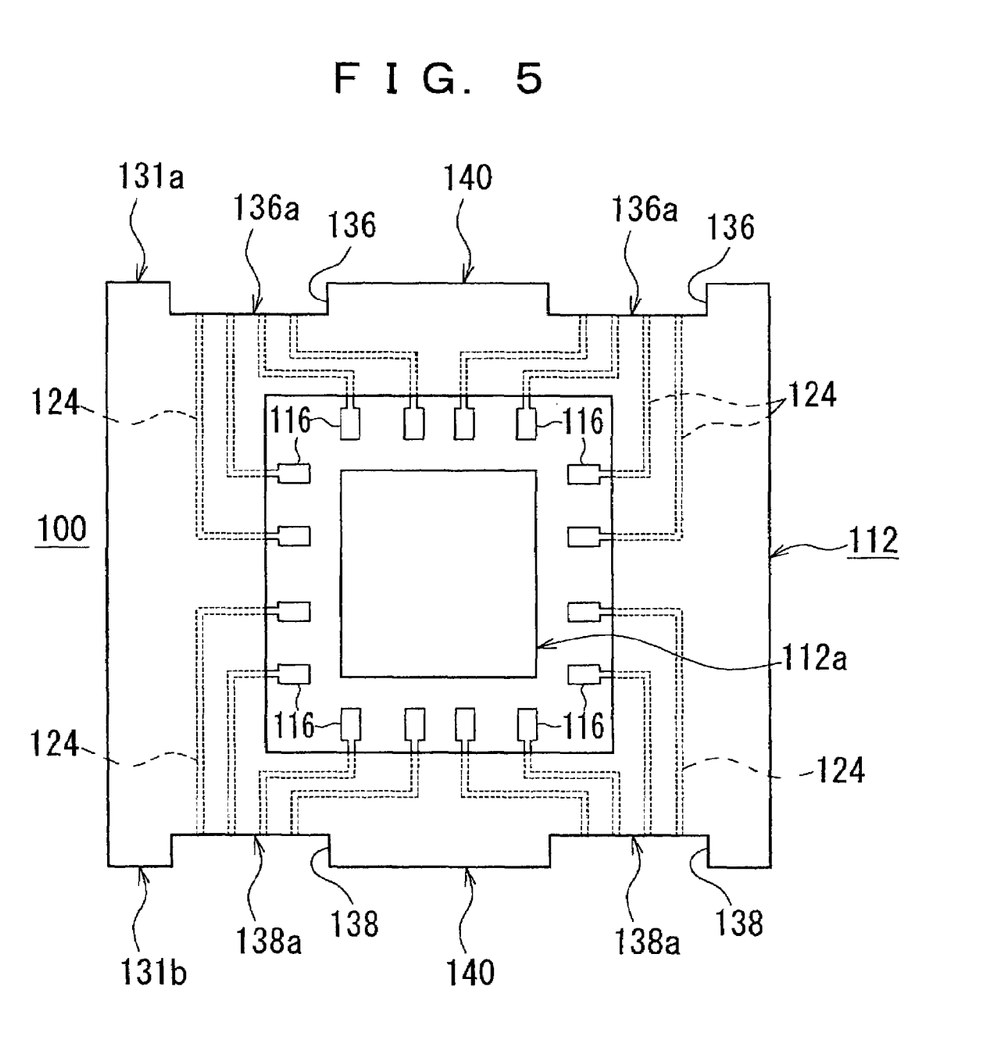
FIG. 5 is a plan view of an essential part showing an embodiment of a substrate for a semiconductor device in accordance with this invention.
Figure 6:
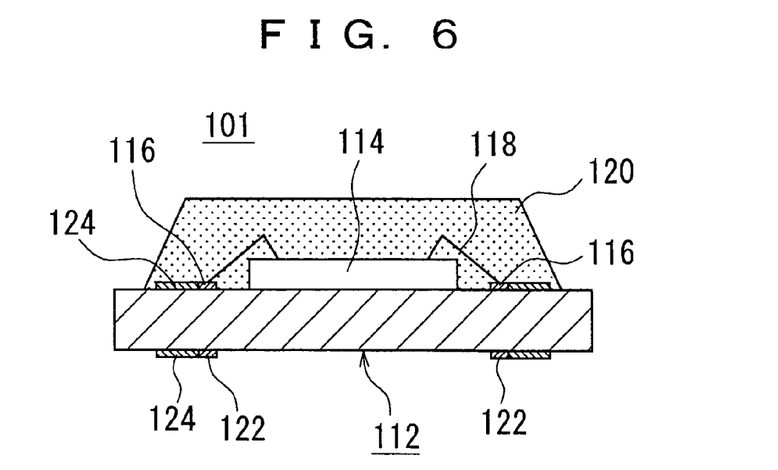
FIG. 6 is a cross sectional view of a semiconductor device using the substrate for a semiconductor device in accordance with this invention.
Figure 7:
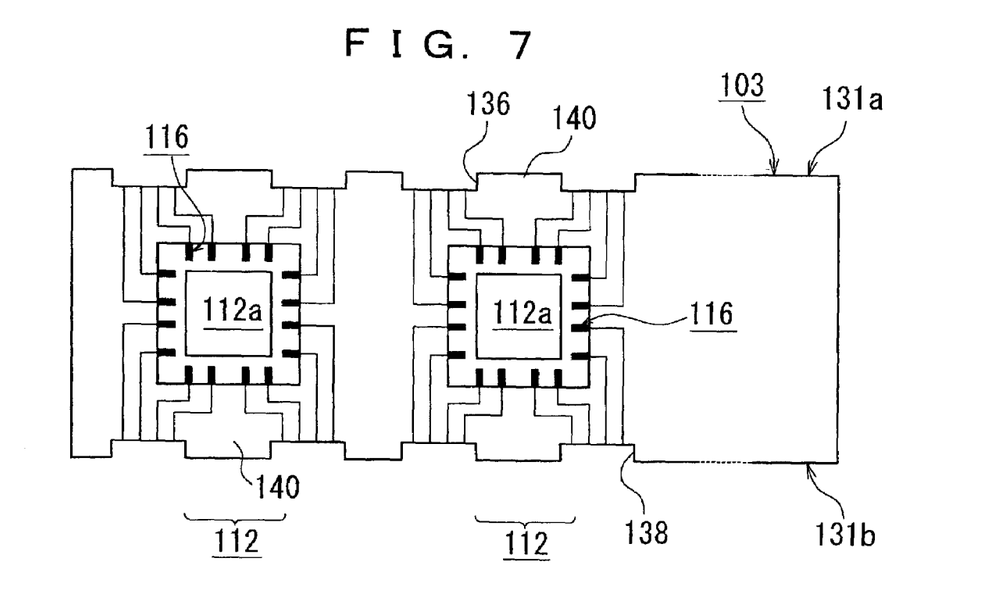
FIG. 7 is a plan view of a frame main body of the invention.

FIG. 5 shows an embodiment of a lead frame 100 to be used as the substrate for a semiconductor device in accordance with this invention. FIG. 6 is a cross-sectional view of the semiconductor device 101 in accordance with this invention using this lead frame 100. FIG. 7 shows a frame main body 103, which is to be segmented into each lead frame 100 of FIG. 5.

A description will be given by reference to FIGS. 5 to 7. According to the embodiment of this invention, the lead frame 100 comprises a lead frame body 112, which is insulating substrate body. The lead frame 100 also comprises a die pad 112a in rectangle form for mounting and fixing a semiconductor chip 114 on one surface (top surface) of a lead frame body 112. A plurality of bonding electrodes 116 is deposited and formed so as to surround the die pad 112a. The number of bonding electrodes 116 to be formed differs according to the size of the semiconductor chip 114. In each example of the diagrams, the number of bonding electrodes 116 is 16 (4×4) for convenience of description.

On the other surface (bottom surface) of the lead frame body 112, a plurality of external electrodes 122 for allowing the lead frame 100 to be mounted is deposited and formed so as to be in rectangle form. Each external electrode 122 is electrically connected to the bonding electrode 116.

In this invention, not less than one cut-away portion is formed on each of opposite side surfaces 131a and 131b along the longer sides of the lead frame body 112 constituting the lead frame 100. In the embodiment shown in FIG. 5, the lead frame body 112 has respective two cut-away portions 136, 136, 138, and 138 for each side surface, each cut-away portion being cut away from the corresponding opposite side surface 131a or 131b. These two cut-away portions for each side surface are set to be at a prescribed distance from each other, for one die pad 112a. Then, wiring 124 for surface treatment extends on the lead frame body 112 and ends of the wiring 124 for surface treatment are gathered at respective horizontal end faces (bottom portions) 136a, 136a, 138a, and 138a of the side surfaces 131a, 131b of the lead frame body 112.

The wiring 124 for surface treatment is the wiring layers to be used for carrying out the surface treatment of the boding electrodes 116 and the external electrodes 122, as described above. When the surface treatment is an electroplating process, the wiring is used as lead wires for applying a voltage for the plating treatment.

Therefore, as shown in FIG. 5, in this embodiment, the bonding electrodes 116 disposed at the four sections of upper, lower, left, and right sides are respectively divided into two equal groups per section. Thus, the wiring 124 for surface treatment in each group of four individually corresponding to a total of four bonding electrodes 116 is wired so as to be dispersed among their four respective and corresponding cut-away portions 136, 136, 138, and 138.

It is possible to set the depth, width, and the like of the cut-away portions 136, 136, 138, and 138 at given values, respectively. The depth and width of the cut-away portions 136, 136, 138 and 138 are selected in consideration of the sizes of the lead frame 100. They also are selected so as not to be affected by the static electricity charged.

Four respective cut-away portions 136, 136, 138, and 138 are cut away from the corresponding opposite side surfaces 131a and 131b, as described above, so that the protrusion portions 140, 140 from the bottom portions 136a and 136a, 138a and 138a of the side surfaces 131a, 131b of the lead frame body 112 remain. The protrusion portions 140, 140 are used as chucking portions by a chucking unit. Whereas, for a transfer unit, the protrusion portions 140, 140 are mounted on the transfer unit.

Gathering the wiring 124 for surface treatment in each of the bottom portions 136a, 136a, 138a, and 138a of the side surfaces 131a, 131b of the lead frame body 112 opposed the plurality of the cut portions 136, 136, 138 and 138 in this manner allows the ends of the wiring 124 for surface treatment and the transfer unit or the chucking unit to avoid coming in direct contact with each other.

As a result, it is possible to provide a lead frame 100 and a manufacturing method thereof which are capable of protecting the semiconductor chip 114 from electrostatic damage with effectiveness and reliability. It also is possible to provide a semiconductor device 101 resistant to electrostatic damage.

When the semiconductor device 101 itself is transferred and/or chucked by the transfer unit and the chucking unit, respectively, and the lead frame 100 is electrostatically charged by friction with these units, the charged surfaces are the protrusion portions 140, 140 provided on the lead frame body 112. Since each of the protrusion portions 140, 140 and the wiring 124 for surface treatment are relatively away from each other, there is a low possibility that the static electricity may be discharged through the wiring 124 for surface treatment as a discharge path. Further, even if the protrusion portions 140, 140 are charged, the contact area with the transfer unit, the chucking unit, or the like is small and very narrow, thereby resulting in a small amount of charge. As a result, even if the wiring 124 for surface treatment acts as a discharge path, this conceivably has little effect on the semiconductor chip 114.

If the semiconductor chip 114 itself is charged, discharge occurs upon wire bonding by gold wires 18 when the wiring 124 for surface treatment is contacted to the metallic portions of the transfer unit or the chucking unit. In a conventional configuration, the wiring 124 for surface treatment and the like tends to come into contact with the metallic portion of the transfer unit or the like. As a result, discharge is more likely to occur. However, if the wiring 124 for surface treatment is gathered in the bottom portions 136a, 136a, 138a, and 138a of the side surfaces 131a, 131b of the lead frame body 112 opposed the cut-away portions 136, 136, 138, and 138 according to this invention, the wiring 124 for surface treatment becomes less likely to come into contact with the metallic portion of the transfer unit or the like. As a result, discharge becomes less likely to occur. This enables the semiconductor chip 114 to enhance its capacity for protection against electrostatic damage.

Further, the insulating components of the transfer unit, or the insulating portions of the chucking unit, may become electrostatically charged during the operations of a semiconductor processing apparatus. At this step, discharge paths may be formed via the wiring 124 for surface treatment. In accordance with this embodiment, the probability of formation of the discharge paths by the wiring 124 for surface treatment also is very low in this case this is because the cut ends of the wiring 124 for surface treatment are present on the bottom portions 136a, 136a, 138a, and 138a of the side surfaces 131a, 131b of the lead frame body 112 cut more inwardly from the protrusion portions 140, 140 and thus, the gap for forming the discharge paths becomes wider than the conventional one. Thus, the probability of forming the discharge paths becomes very low. As a result, there is no possibility that the semiconductor chip 114 is damaged by static electricity.

Figure 8:
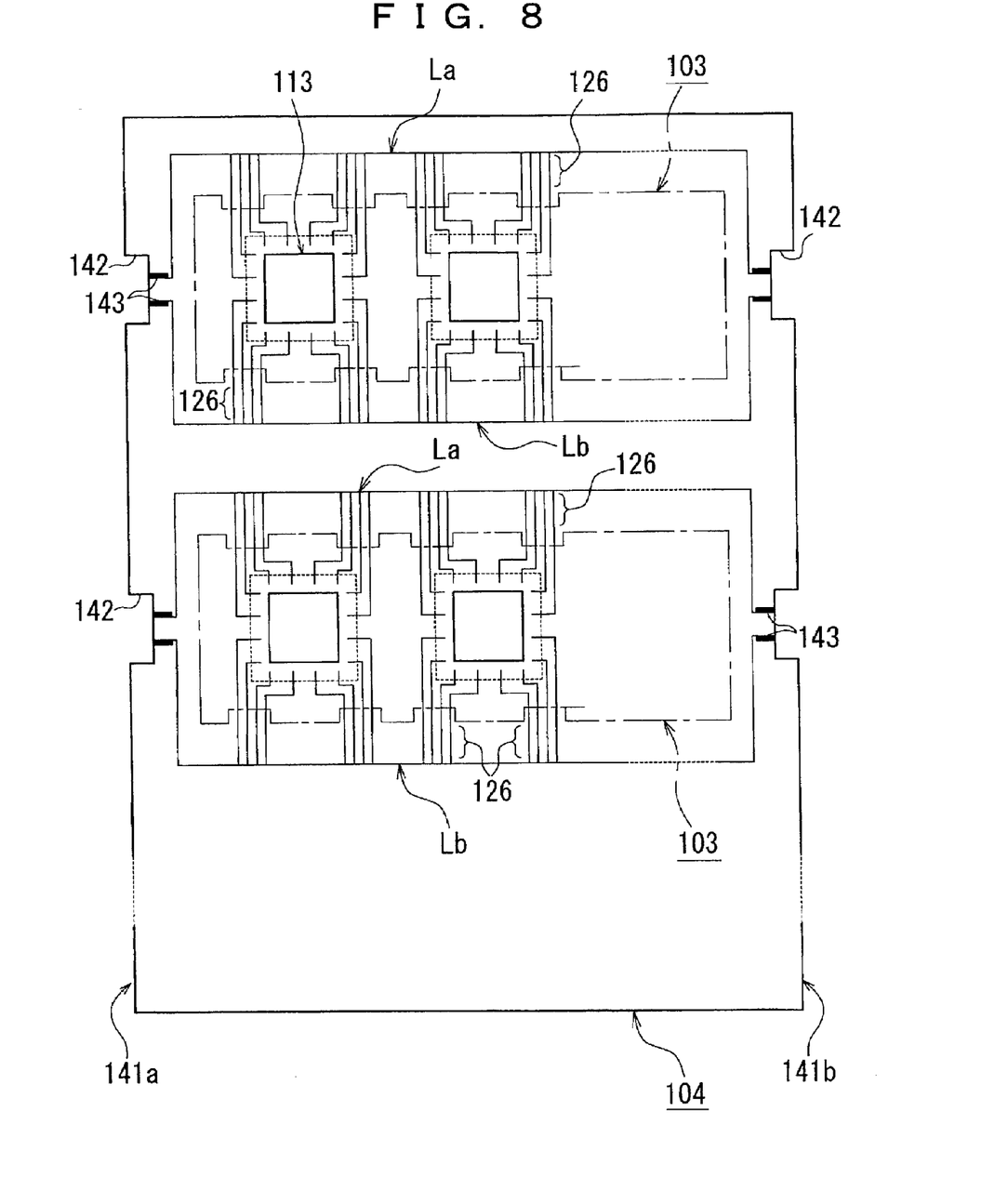
FIG. 8 is a plan view of an original plate of the invention for providing the frame main bodies.

Incidentally, it is possible to form the frame main bodies 103 as configured in FIG. 7 by dividing the original plate 104 as shown in FIG. 8. FIG. 8 shows the original plate 104, which is an insulating substrate having a size capable of providing a plurality of frame main bodies 103. Openings 142 are provided at their respective prescribed positions (respective positions of the left and right opposite side surfaces 141a, 141b in a case shown in FIG. 8). Buses La and Lb are wired so as to extend between the left and right openings 142, 142. Pairs of connection terminals 143, 143 are respectively provided in a portion of the original plate 104, the portion being opposed to the opening 142.

The surface of the original plate 104 to be the frame main bodies 103 is subjected to an insulation treatment by a solder resist, except for prescribed sections. Mutual connections between a plurality of the wiring 124 for surface treatment connected to their respective bonding electrodes 116 formed on each frame main body 103 and the buses La and Lb are established by secondary lines 126. The connections between the plurality of the wiring 124 for surface treatment connected to their respective external electrodes 122 and the buses La and Lb also are established by secondary lines 126.

In this drawing, there are shown only the secondary lines 126 connected between the wiring 124 for surface treatment corresponding to the bonding electrodes 116 and the buses La and Lb. The wiring 124 for surface treatment is patterned so as to pass through the positions at which the cut-away portions 136, 136, 138, and 138 will be formed later, and connected to their respective corresponding secondary lines 126.

Subsequently, the original plate 104 is subjected to a plating treatment. The plating treatment is an electroplating process. In this embodiment, first, nickel plating is performed. Then, a gold plating treatment is performed. Thereafter, the original plate 104 is cut along dot-dash lines in the drawing and divided into a plurality of the frame main bodies 103. Simultaneously, upon division into the plurality of the frame main bodies 103, the cut-away portions 136, 136, 138, and 138 also are formed.

After division into the frame main bodies 103, the bonding treatment, the wire bonding treatment using the gold wires 118, and the mold treatment of the semiconductor chip 114 are performed as with the conventional method. Then, the frame main body 103 is cut into lead frames 100 to manufacture the semiconductor device 101, as shown in FIG. 6. According to this invention, it is possible to protect the semiconductor chip from electrostatic damage during such treatment steps with effectiveness. This enables the semiconductor device to enhance its capacity for protection against electrostatic damage.

A description will be given to another embodiment of the substrate for a semiconductor device in accordance with this invention.

Figure 9:
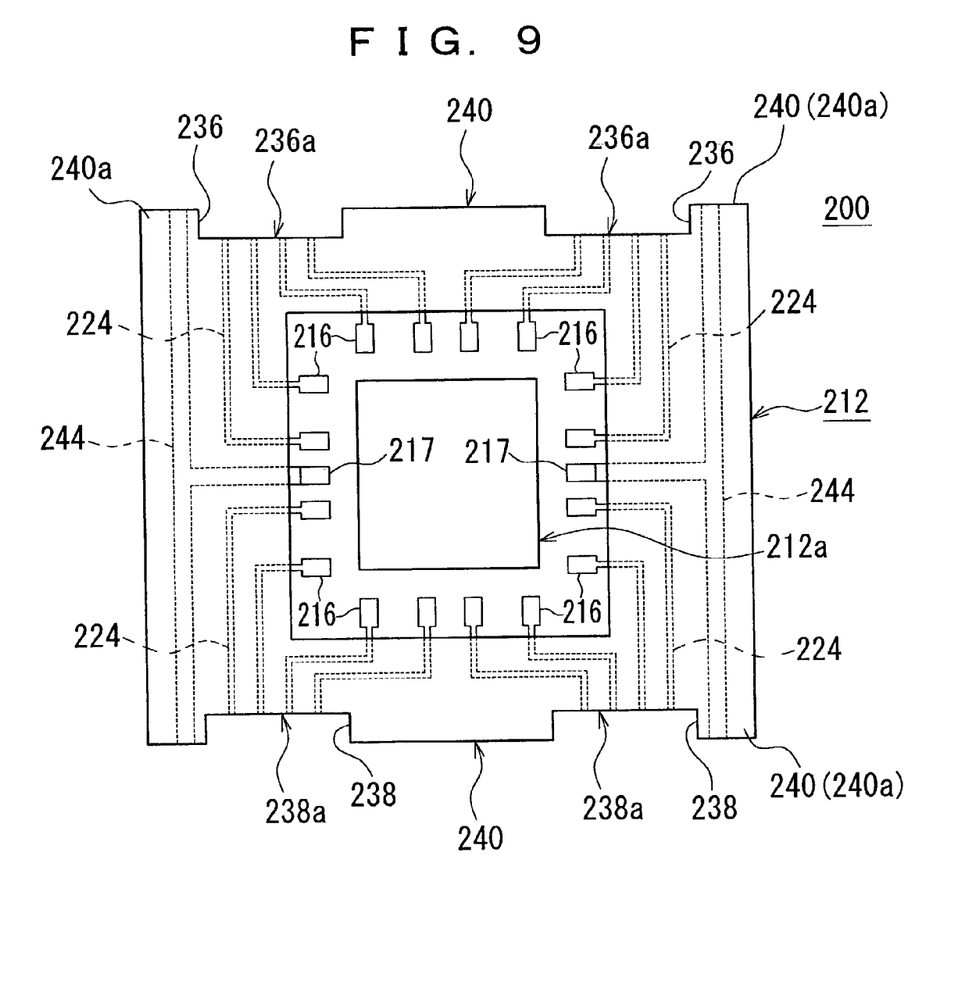
FIG. 9 is a plan view of an essential part showing another embodiment of the substrate for a semiconductor device in accordance with this invention.
Figure 10:
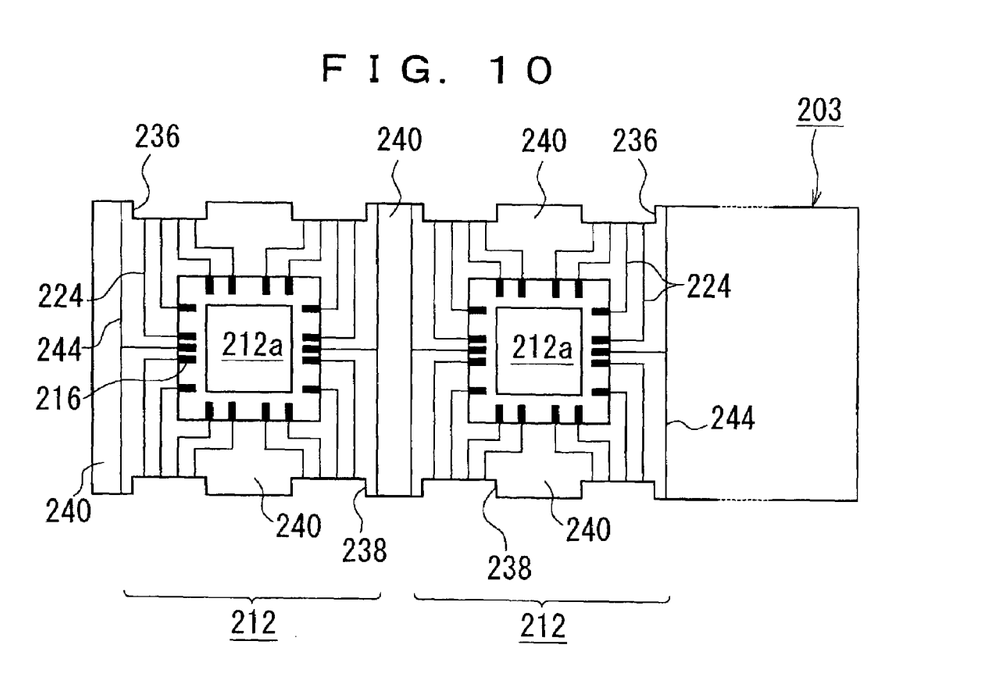
FIG. 10 is a plan view of a frame main body of this another embodiment.

FIGS. 9 and 10 show an embodiment wherein such a configuration is adopted that allows the static electricity charged on the semiconductor chip 114 shown in FIG. 6, which the lead frame 100 shown in FIG. 5 mounts, to be discharged by utilizing the wiring 244 for power supply (wiring for grounding) connected to the semiconductor chip 114. FIG. 9 shows a lead frame 200. The lead frame 200 has a lead frame body 212. Each of the lead frames 200 is segmented from a frame main body 203 shown in FIG. 10.

As apparent from the embodiment shown in FIG. 9, the wiring 244 for power supply or grounding is wired with respect to bonding electrodes 217, 217 for power supply or grounding. The wiring 244 for power supply or grounding has a little larger width than the other wiring 224 for surface treatment has. The wiring 244 for power supply or grounding is used as power supply lines or grounding lines when the semiconductor device 101, as shown in FIG. 6, is mounted. Such wiring 244 for power supply or grounding with a larger width allows the resistance to the electrostatic damage to be enhanced.

The wiring 244 for power supply or grounding extends on the lead frame body 212. Ends of the wiring 244 for power supply or grounding, however, are present on protrusion portions 240, 240 of the side surfaces of the lead frame body 212, i.e., the narrower protrusion portions 240a, 240a for each side surface in this example, not bottom portions 236a, 236a, 238a, and 238a of the side surfaces of the lead frame body 212 opposed to the cut-away portions 236, 236, 238, and 238.

When extending the wiring 244 for power supply or grounding through the protrusion portions 240, 240 (the outermost side surfaces of the substrate), the cut ends of the wiring 244 for power supply or grounding become more likely to come into contact with the metallic portion of the transfer unit or the chucking unit. Therefore, if the wiring 244 for power supply or grounding comes in contact with the metallic portion of the transfer unit or the like, the static electricity accumulated in the semiconductor chip 114 is discharged to the side of the transfer unit or the chucking unit via the wiring 244 for power supply or grounding. As a result, it is possible to prevent electrostatic damage to the semiconductor chip 114

Further, the wiring 244 for power supply or grounding is set at opposite sides of the wiring 224 for surface treatment provided at bottom portions 236a, 236a, 238a, and 238a of the side surfaces of the lead frame body 212 opposed to the cut-away portions 236, 236, 238, and 238. Namely, the wiring 224 for surface treatment is positioned between one wiring 244 for power supply or grounding and the other wiring 244 for power supply or grounding. Therefore, in the segmentation process (dicing process of a semiconductor wafer) for manufacturing the semiconductor device, metallic material, such as a metallic mold for outline processing, first comes into contact with the wiring 244 for power supply or grounding. This results in such a situation that discharge occurs via the wiring 244 for power supply or grounding. As a result, it is possible to prevent electrostatic damage to the semiconductor chip 114.

Figure 11:
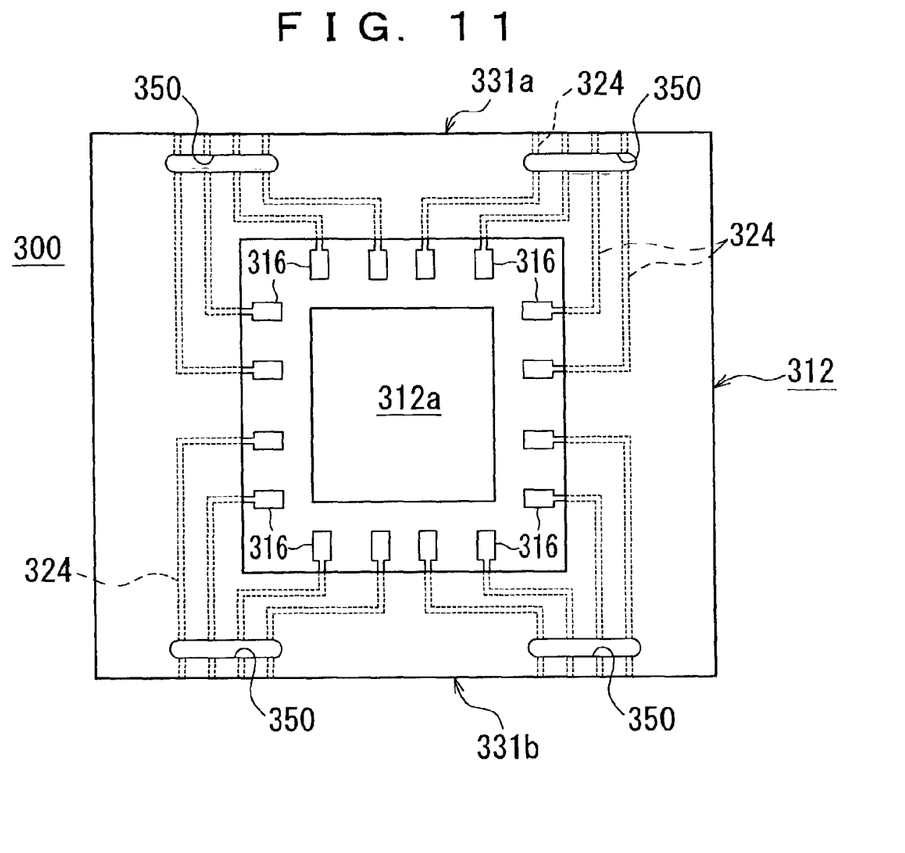
FIG. 11 is a plan view of an essential part showing a further embodiment of the substrate for a semiconductor device in accordance with this invention.
Figure 12:
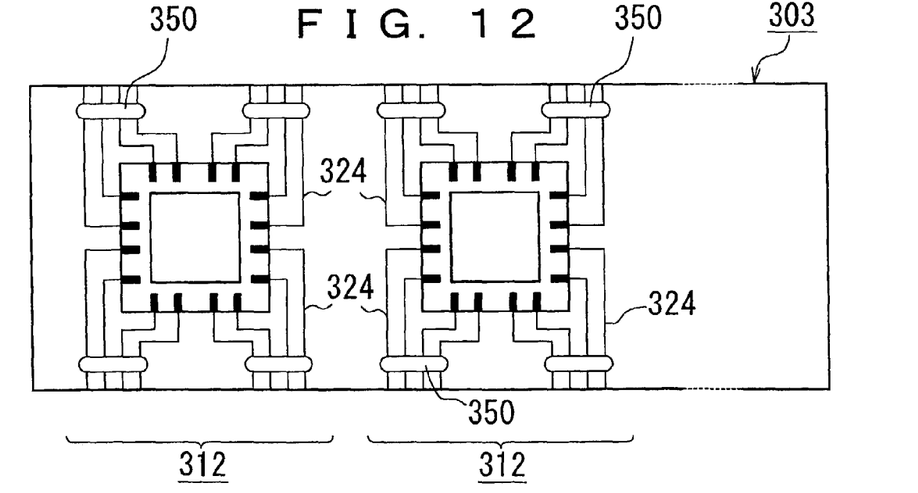
FIG. 12 is a plan view of a frame main body of this further embodiment.

Additionally, FIGS. 11 and 12 show a further embodiment of the substrate for a semiconductor device in accordance with this invention. FIG. 11 shows a lead frame 300, which is the substrate for a semiconductor device. The lead frame 300 has a lead frame body 312, which is insulating substrate body. Each of the lead frames 300 is segmented from a frame main body 303 shown in FIG. 12.

In this embodiment, the wiring 324 for surface treatment, which has been used for the surface treatment, is divided at its midpoint in place of forming the above cut-away portions. For example, in this embodiment, when the wiring 324 for surface treatment is dispersed into four groups as shown in FIG. 11, four slits 350 are formed so as to respectively divide the wiring 324 for surface treatment at some midpoints.

According to this configuration, the cut ends of the wiring 324 for surface treatment are present on the outermost side surfaces 331a, 331b of the lead frame body 312. Therefore, there is a high possibility that the cut ends may come into contact with the metallic portions of the transfer unit or the like. However, each of the slits 350 divides the wiring 324 for surface treatment. Accordingly, even if the transfer unit or the semiconductor chip is electrostatically charged, the wiring 324 for surface treatment will not function as discharge paths via the semiconductor chip. This allows the semiconductor chip to be protected from electrostatic damage with effectiveness and reliability.

Incidentally, although not shown, the wiring for the power supply and the wiring for grounding in connection with the semiconductor chip are wired in a bypassing manner so as not to be divided by the slits 350.

Any of the embodiments described above shows the case where the wiring for surface treatment is formed on the insulating substrate. Then, in these cases, such a configuration has been devised that the wiring for surface treatment refrains from acting as discharge paths of the static electricity including the semiconductor chip.

Alternatively, as the surface treatments for the bonding electrodes 116, 216, and 316 and the external electrodes of the lead frames 100, 200, and 300, an electroless plating process is conceivable, other than the electroplating process as described above. For the electroless plating process, the wiring for surface treatment for the bonding electrodes is unnecessary. Similarly, the wiring for surface treatment for the external electrodes also is unnecessary. In this case, only the wiring for connecting the bonding electrodes with the external electrodes is necessary.

Figure 13:
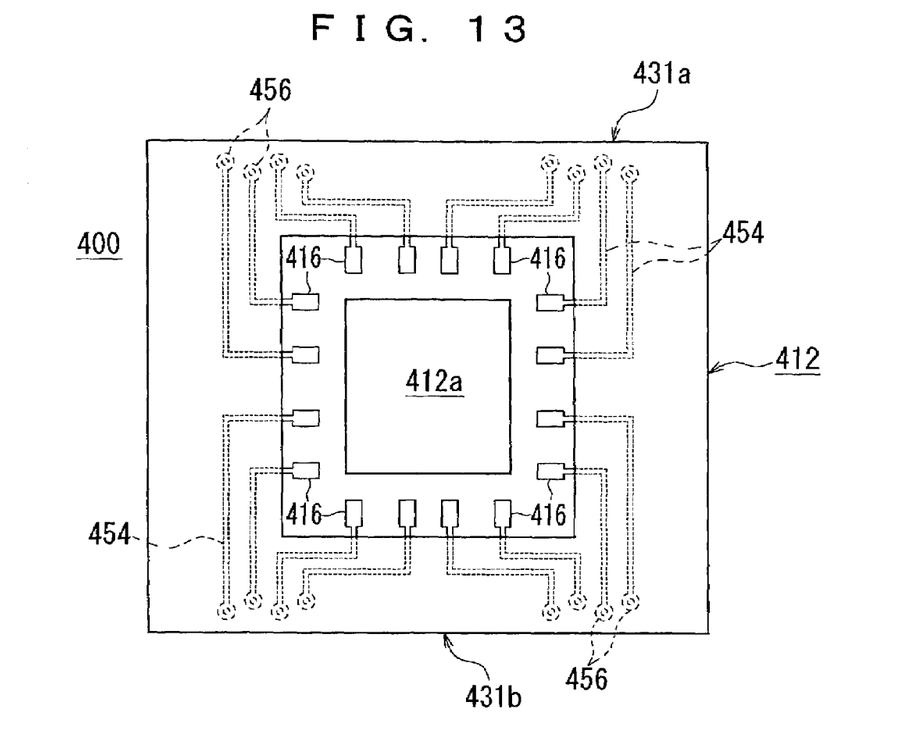
FIG. 13 is a plan view of an essential portion showing a still further embodiment of the substrate for a semiconductor device in accordance with this invention.
Figure 14:
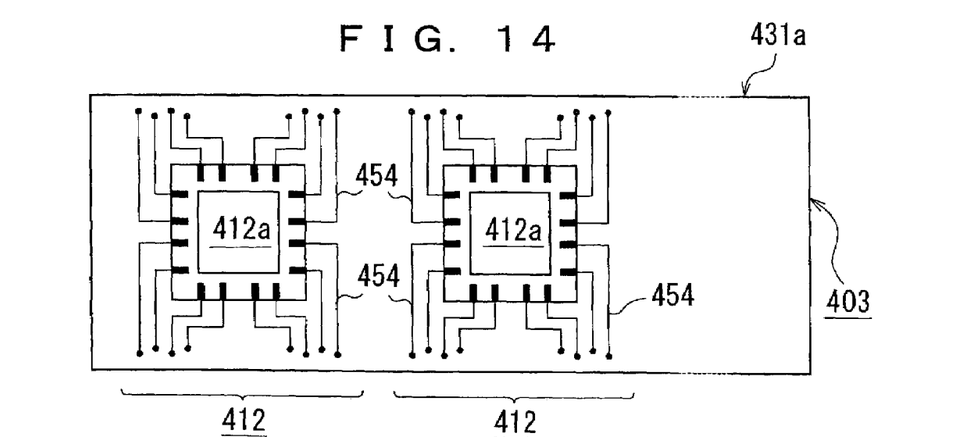
FIG. 14 is a plan view of a frame main body of this still further embodiment.

Next, FIGS. 13 and 14 show a substrate for a semiconductor device when the surface treatment is performed according to the electroless plating process, as a still further embodiment of this invention. FIG. 13 shows a lead frame 400, which is the substrate for a semiconductor device in accordance with the invention. The lead frame 400 has lead frame body 412, which is insulating substrate body. Each of the lead frames 400 is segmented from a frame main body 403 shown in FIG. 14.

When the surface treatment of the bonding electrodes 416 and the external electrodes of the lead frame 400 is performed according to the electroless plating process, the cut-away portions 136, 136, 138, and 138, as shown in FIG. 5, are not required to be formed. Thus, the lead frame body 412 of this embodiment, as shown in FIG. 13, has the same plan configuration as the conventional one.

The wiring 454 for connection between the bonding electrodes 416 and the external electrodes of the lead frame 400 is formed at least on a top surface of the lead frame body 412. The wiring 454 for connection extends on the lead frame body 412 up to respective appropriate portions thereof, not to the opposite side surfaces 431a, 431b of the lead frame body 412. Namely, ends of the wiring 454 for connection are located at the inside from the side surfaces 431a, 431b of the lead frame body 412. The connection between the ends and the external electrodes positioned under the lead frame 400 is established using through holes 56, as shown in FIG. 13, or the like.

Since no wiring extends to the outermost side surfaces 431a, 431b of the lead frame body 412 as the wiring 54 for connection, the wiring 54 for connection cannot come into contact with the metallic portion of the transfer unit, the chucking unit, and the like. Accordingly, the wiring 54 for connection forms no discharge path via the semiconductor chip mounted on the lead frame 400. In consequence, this prevents the semiconductor chip from being damaged by static electricity.

As described above, in accordance with the above embodiment of this invention, such a configuration is adopted that the ends of the wiring for surface treatment are gathered in portions of the side surfaces of the substrate for the semiconductor device opposed the respective corresponding cut-away portions. Alternatively, such a configuration is adopted that the wiring for the connection between the electrodes disposed on the upper and lower opposite sides of the substrate for the semiconductor device refrains extending to the side faces of the substrate for the semiconductor device.

With these configurations, the transfer unit or the chucking unit does not come into contact with the wiring for surface treatment or the other wiring during transfer or during chucking. Therefore, even for a semiconductor chip of LGA, BGA, or the like, which tends to undergo electrostatic damage, it is possible to protect the semiconductor chip from electrostatic damage with effectiveness.

Further, in accordance with the manufacturing method of this invention, after carrying out the surface treatment, the wiring used for the surface treatment is divided by cutting, slitting, or the like. With this configuration, even if the ends of the wiring for surface treatment are exposed at the side surfaces of the substrate for the semiconductor device, the internal wiring for surface treatment is electrically disconnected. Therefore, the electrostatic charge is not transferred to the semiconductor chip via the wiring for surface treatment. As a result, there is no risk that the semiconductor chip will be damaged by static electricity.

Thus, in accordance with this invention, it is possible to provide a substrate for a semiconductor device that is resistant to electrostatic damage. Further, it also is possible to provide a semiconductor device and a frame main body, which include such substrate for a semiconductor device, that is resistant to electrostatic damage.

Therefore, this invention is preferably applicable to the substrate for a semiconductor device of higher density- and higher speed-oriented LGA, BGA, or the like.

While the foregoing specification has described preferred embodiments of the present invention, one skilled in the art may make many modifications to the preferred embodiments without departing from the invention in its broader aspects. The appended claims therefore are intended to cover all such modifications as fall within the true scope and spirit of the invention.

What is claimed is:

1. A substrate for a semiconductor device comprising:
   an insulating substrate body having a plurality of cut-away portions cut away from at least one side edge surface thereof at a distance from each other, and defining an elongated surface of each of said cut-away portions for receiving gathered ends of wiring for surface treatment, and defining between an adjacent pair of said cut-away portions a protrusion serving as a chucking portion for allowing said substrate body to be chucked;
   a die pad for securing a semiconductor chip, said die pad being positioned on said insulating substrate body;
   a plurality of bonding electrodes surrounding said die pad;
   a plurality of external electrodes for allowing said substrate for a semiconductor device to be mounted, each external electrode being electrically connected to a corresponding one of said plurality of bonding electrodes and being positioned under said insulating substrate body;
   a plurality of wiring segments being divided into a plurality of wiring segment groups for surface treatment, gathered ends of which terminate at said elongated surface of said cut-away portions, wherein each wiring segment of a wiring segment group extends on said insulating substrate body such that each wiring segment connects each external electrode to the corresponding one of said plurality of bonding electrodes through a common one of the plurality of cut-away portions; and
   wiring for supplying power to said semiconductor chip and for grounding, wherein the wiring for supplying power to said semiconductor chip and for grounding is located at least at one of the side edges of said insulating substrate body except for said cut-away portion wherein the wiring for supplying power to said semiconductor chip and for grounding is located on both sides of said wiring for surface treatment, said wiring for surface treatment being located at said portion of said side surface of said insulating substrate body, and said portion being opposed to said cut-away portion, and wherein said wiring for surface treatment is positioned between one wiring for supplying power to said semiconductor chip and for grounding and the other wiring for supplying power to said semiconductor chip and for grounding, and
   wherein said wiring for supplying power to said semiconductor chip and for grounding has a width wider than that for said wiring for surface treatment for enhancing resistance to electrostatic damage.

2. The substrate for a semiconductor device as claimed in claim 1, wherein said surface treatment is an electroplating process.

3. A semiconductor device comprising:
   a substrate for a semiconductor device having an insulating substrate body having a plurality of cut-away portions cut away from at least one side edge surface thereof at a distance from each other, and defining an elongated surface of each of said cut-away portions for receiving gathered ends of wiring for surface treatment, and defining between an adjacent pair of said cut-away portions a protrusion serving as a chucking portion for allowing said substrate body to be chucked;

a semiconductor chip secured on said substrate for a semiconductor device;

sealing compound for sealing said semiconductor chip, wherein said substrate includes a plurality of bonding electrodes on a first side of said substrate on which said semiconductor chip is mounted, and wherein said substrate includes a plurality of external electrodes on a second side of said substrate that allows said substrate to be mounted, and wherein the bonding electrodes and the external electrodes are provided with a plurality of wiring segments that are divided into a plurality of wiring segment groups for surface treatment, gathered ends of which are located at said elongated surface of said cut-away portions, wherein each wiring segment of said plurality of wiring segment groups extends on said insulating substrate body thereby connecting one of the plurality of said bonding electrodes to a corresponding one of the plurality of external electrodes via a common one of a plurality of cut-away portions located on the side edges of said insulating substrate body; and wiring for supplying power to said semiconductor chip and for grounding, wherein the wiring for supplying power to said semiconductor chip and for grounding is located at at least one of the side edges of said insulating substrate body except for said cut-away portion at both sides of said wiring for surface treatment.

4. The semiconductor device as set forth in claim 3 wherein said wiring for supplying power to said semiconductor chip and for grounding has a width wider than that for said wiring for surface treatment for enhancing resistance to electrostatic damage.

5. A substrate for a semiconductor device comprising:

an insulating substrate body having a plurality of cut-away portions cut away from at least one side edge surface thereof at a distance from each other, and defining an elongated surface of each of said cut-away portions receiving gathered ends of wiring for surface treatment, and defining between an adjacent pair of said cut-away portions a protrusion serving as a chucking portion for allowing said substrate body to be chucked;

a die pad for securing a semiconductor chip, said die pad being positioned on said insulating substrate body;

a plurality of bonding electrodes surrounding said die pad;

a plurality of external electrodes for allowing said substrate for a semiconductor device to be mounted, each external electrode being electrically connected to a corresponding one of said plurality of bonding electrodes and being positioned under said insulating substrate body;

a plurality of wiring segments being divided into a plurality of wiring segment groups for surface treatment, gathered ends of which communicate with said elongated surface of said cut-away portion, wherein each wiring segment of a wiring segment group extends on said insulating substrate body such that each wiring segment connects each external electrode to the corresponding one of said plurality of bonding electrodes through a common one of the plurality of cut-away portions; and wiring for supplying power to said semiconductor chip and for grounding, wherein the wiring for supplying power to said semiconductor chip and for grounding extends to at least one of a plurality of protruding portions of said insulating substrate body.

6. The substrate for a semiconductor device as set forth in claim 5 wherein said wiring for supplying power to said semiconductor chip and for grounding has a width wider than that for said wiring for surface treatment for enhancing resistance to electrostatic damage.

* * * * *